(12) United States Patent
Sewell (10) Patent No.: US 8,456,611 B2
(45) Date of Patent: Jun. 4, 2013

(54) SYSTEM AND METHOD TO INCREASE SURFACE TENSION AND CONTACT ANGLE IN IMMERSION LITHOGRAPHY

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 209 days.

(21) Appl. No.: 12/834,691

(22) Filed: Jul. 12, 2010

(65) Prior Publication Data

US 2010/0271604 A1    Oct. 28, 2010

Related U.S. Application Data

(63) Continuation of application No. 11/288,133, filed on Nov. 29, 2005, now Pat. No. 7,773,195.

(51) Int. Cl.
*G03B 27/42*    (2006.01)
*G03B 27/52*    (2006.01)
*G03B 27/58*    (2006.01)

(52) U.S. Cl.
USPC ............................. 355/53; 355/30; 355/72

(58) Field of Classification Search
USPC ................. 355/30, 53, 55, 72; 359/665
See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,405,701 A | 9/1983 | Banks et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |
| 6,560,032 B2 | 5/2003 | Hatano | |
| 6,600,547 B2 | 7/2003 | Watson et al. | |
| 6,603,130 B1 | 8/2003 | Bisschops et al. | |

(Continued)

FOREIGN PATENT DOCUMENTS

| DE | 206607 | 2/1984 |
|---|---|---|
| DE | 221563 A1 | 4/1985 |

(Continued)

OTHER PUBLICATIONS

Chinese Office Action for Chinese Application No. 200610160480.3 2009 dated Sep. 4, 2009.

(Continued)

*Primary Examiner* — Peter B Kim
(74) *Attorney, Agent, or Firm* — Pillsbury Winthrop Shaw Pittman LLP (57) ABSTRACT

A system and method to allow organic fluids to be used in immersion lithographic systems. This is done by providing a showerhead portion of a liquid supply system that is partially coated or made from a TEFLON like material. The TEFLON like material reduces wetness effect, and thus increases containment, when using an organic immersion fluid in a space between the last optic and the substrate.

20 Claims, 9 Drawing Sheets

U.S. PATENT DOCUMENTS

| | | | |
|---|---|---|---|
| 6,633,365 | B2 | 10/2003 | Suenaga |
| 6,649,093 | B2 | 11/2003 | Van Santen et al. |
| 6,781,670 | B2 | 8/2004 | Krautschik |
| 6,788,477 | B2 | 9/2004 | Lin |
| 6,809,794 | B1 | 10/2004 | Sewell |
| 6,844,206 | B1 | 1/2005 | Phan et al. |
| 6,844,919 | B2 | 1/2005 | Suenaga |
| 6,952,253 | B2 | 10/2005 | Lof et al. |
| 2002/0020821 | A1 | 2/2002 | Van Santen et al. |
| 2002/0163629 | A1 | 11/2002 | Switkes et al. |
| 2003/0123040 | A1 | 7/2003 | Almogy |
| 2003/0174408 | A1 | 9/2003 | Rostalski et al. |
| 2004/0000627 | A1 | 1/2004 | Schuster |
| 2004/0021844 | A1 | 2/2004 | Suenaga |
| 2004/0075895 | A1 | 4/2004 | Lin |
| 2004/0103950 | A1 | 6/2004 | Iriguchi |
| 2004/0109237 | A1 | 6/2004 | Epple et al. |
| 2004/0114117 | A1 | 6/2004 | Bleeker |
| 2004/0118184 | A1 | 6/2004 | Violette |
| 2004/0119954 | A1 | 6/2004 | Kawashima et al. |
| 2004/0125351 | A1 | 7/2004 | Krautschik |
| 2004/0135099 | A1 | 7/2004 | Simon et al. |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0169834 | A1 | 9/2004 | Richter et al. |
| 2004/0207824 | A1 | 10/2004 | Lof et al. |
| 2004/0211920 | A1 | 10/2004 | Mari Derksen et al. |
| 2004/0233405 | A1 | 11/2004 | Kato et al. |
| 2004/0239954 | A1 | 12/2004 | Bischoff |
| 2004/0257544 | A1 | 12/2004 | Vogel et al. |
| 2004/0263808 | A1 | 12/2004 | Sewell |
| 2004/0263809 | A1 | 12/2004 | Nakano |
| 2005/0002004 | A1 | 1/2005 | Kolesnychenko et al. |
| 2005/0007569 | A1 | 1/2005 | Streefkerk et al. |
| 2005/0007570 | A1 | 1/2005 | Streefkerk et al. |
| 2005/0018155 | A1 | 1/2005 | Cox et al. |
| 2005/0018156 | A1 | 1/2005 | Mulkens et al. |
| 2005/0018208 | A1 | 1/2005 | Levinson |
| 2005/0024609 | A1 | 2/2005 | De Smit et al. |
| 2005/0030498 | A1 | 2/2005 | Mulkens |
| 2005/0030501 | A1 | 2/2005 | Mulkens et al. |
| 2005/0030506 | A1 | 2/2005 | Schuster |
| 2005/0036121 | A1 | 2/2005 | Hoogendam et al. |
| 2005/0036183 | A1 | 2/2005 | Yeo et al. |
| 2005/0036184 | A1 | 2/2005 | Yeo et al. |
| 2005/0037269 | A1 | 2/2005 | Levinson |
| 2005/0046934 | A1 | 3/2005 | Ho et al. |
| 2005/0048223 | A1 | 3/2005 | Pawloski et al. |
| 2005/0078286 | A1 | 4/2005 | Dierichs et al. |
| 2005/0078287 | A1 | 4/2005 | Sengers et al. |
| 2005/0175776 | A1 | 8/2005 | Streefkerk et al. |
| 2005/0231695 | A1 | 10/2005 | Wang et al. |
| 2006/0033901 | A1* | 2/2006 | Hara .............................. 355/53 |
| 2006/0176456 | A1 | 8/2006 | Nagasaka et al. |
| 2007/0122561 | A1 | 5/2007 | Sewell |
| 2008/0094590 | A1 | 4/2008 | Coon |
| 2008/0273248 | A1 | 11/2008 | Beder et al. |

FOREIGN PATENT DOCUMENTS

| | | |
|---|---|---|
| DE | 224448 A1 | 7/1985 |
| DE | 242880 A1 | 2/1987 |
| EP | 0023231 A1 | 2/1981 |
| EP | 0418427 A2 | 3/1991 |
| EP | 1039511 A1 | 9/2000 |
| EP | 1 482 372 | 12/2004 |
| EP | 1 582 929 | 10/2005 |
| EP | 1 598 855 | 11/2005 |
| EP | 1 753 016 | 2/2007 |
| FR | 2474708 | 7/1981 |
| JP | 58-202448 A | 11/1983 |
| JP | 62-065326 A | 3/1987 |
| JP | 62-121417 A | 6/1987 |
| JP | 63-157419 A | 6/1988 |
| JP | 04-305915 A | 10/1992 |
| JP | 04-305917 A | 10/1992 |
| JP | 06-124873 A | 5/1994 |
| JP | 07-132262 A | 5/1995 |
| JP | 07-220990 A | 8/1995 |
| JP | 10-228661 A | 8/1998 |
| JP | 10-255319 A | 9/1998 |
| JP | 10-303114 A | 11/1998 |
| JP | 10-340846 A | 12/1998 |
| JP | 11-176727 A | 7/1999 |
| JP | 2000-058436 A | 2/2000 |
| JP | 2001-091849 A | 4/2001 |
| JP | 2004-193252 A | 7/2004 |
| WO | WO 99/49504 A1 | 9/1999 |
| WO | WO 03/077036 A1 | 9/2003 |
| WO | WO 03/077037 A1 | 9/2003 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057295 A2 | 7/2004 |
| WO | WO 2004/057589 A1 | 7/2004 |
| WO | WO 2004/086468 A1 | 10/2004 |
| WO | WO 2004/086470 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/090956 A1 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/097911 A1 | 11/2004 |
| WO | WO 2004/102646 A1 | 11/2004 |
| WO | WO 2004/105106 A1 | 12/2004 |
| WO | WO 2004/105107 A1 | 12/2004 |
| WO | WO 2004/107011 A1 | 12/2004 |
| WO | WO 2004/107417 A1 | 12/2004 |
| WO | WO 2004/112108 A1 | 12/2004 |
| WO | WO 2004/114380 A1 | 12/2004 |
| WO | WO 2005/006415 | 1/2005 |
| WO | WO 2005/015315 A2 | 2/2005 |
| WO | WO 2005/022616 A1 | 3/2005 |
| WO | WO 2005/036623 A1 | 4/2005 |
| WO | WO 2005/062351 A1 | 7/2005 |
| WO | 2005/104195 | 11/2005 |

OTHER PUBLICATIONS

Written Opinion for Singapore Application No. SG 200608243-2 mailed Feb. 4, 2008, 4 pgs.

U.S. Reissue U.S. Appl. No. 10/367,910, filed Feb. 19, 2003, entitled "Projection exposure apparatus and method with workpiece area detection," to Kyoichi Suwa.

U.S. Reissue U.S. Appl. No. 11/122,215, filed May 5, 2005, entitled "Projection exposure apparatus and method with workpiece area detection," to Kyoichi Suwa.

"Depth-of-Focus Enhancement Using High Refractive Index Layer on the Imaging Layer", IBM Technical Disclosure Bulletin, vol. 27, No. 11, Apr. 1985, p. 6521.

Hata, H., "The Development of Immersion Exposure Tools", Litho Forum, International SEMATECH, Los Angeles, Jan. 27-29, 2004.

Hoffnagle, J.A. et al., "Liquid Immersion Deep-Ultraviolet Interferometric Lithography", J. Vac. Sci. Technol. B., vol. 17, No. 6, Nov./Dec. 1999, pp. 3306-3309.

Hogan, H., "New Semiconductor Lithography Makes a Splash", Photonics Technology World, Photonics Spectra, Oct. 2003.

Kawata, H. et al., "Fabrication of 0.2 µm-Fine Patterns Using Optical Projection Lithography with an Oil Immersion Lens", Jpn. J. Appl. Phys. vol. 31 (1992), pp. 4174-4177.

Kawata, H. et al., "Optical Projection Lithography using Lenses with Numerical Apertures Greater than Unity", Microelectronic Engineering 9 (1989), pp. 31-36.

Lin, B.J., "Drivers, Prospects and Challenges for Immersion Lithography", TSMC, Inc., Sep. 2002.

Lin, B.J., "Proximity Printing Through Liquid", IBM Technical Disclosure Bulletin, vol. 20, No. 11B, Apr. 1978, p. 4997.

Lin, B.J., "The k3 Coefficient in Nonparaxial 1/NA Scaling Equations for Resolution, Depth of Focus, and Immersion Lithography," *Journal of Microlithography, Microfabrication, and Microsystems*, vol. 1, No. 1, pp. 7-12, Apr. 2002.

Lin, B.J., "The Paths to Subhalf-Micrometer Optical Lithography", SPIE vol. 922, Optical/Laser Microlithography (1988), pp. 256-269.

Matsuyama, T. et al., "Nikon Projection Lens Update", SPIE Microlithography 2004, 5377-65, Mar. 2004.

Nikon Precision Europe GmbH, "Investor Relations—Nikon's Real Solutions," May 15, 2003.

Owa, S. et al., "Advantage and Feasibility of Immersion Lithography", Proc. SPIE 5040 (2003).

Owa, S. et al., "Immersion Lithography; its potential performance and issues", SPIE Microlithography 2003, 5040-186, Feb. 27, 2003.

Owa, S. et al., "Potential Performance and Feasibility of Immersion Lithography", NGL Workshop 2003, Jul. 10, 2003.

Owa, S. et al., "Update on 193nm Immersion Exposure Tool", Litho Forum, International SEMATECH, Los Angeles, Jan. 27-29, 2004.

Owen, G. et al., "1/8 µm Optical Lithography", J. Vac. Sci. Technol. B., vol. 10, No. 6, Nov./Dec. 1992, pp. 3032-3036.

Smith, B.W. et al., "Immersion Optical Lithography at 193nm", FUTURE FAB International, vol. 15, Jul. 11, 2003.

Stevens, G.W.W., "Reduction of Waste Resulting from Mask Defects", Solid State Technology, Aug. 1978, vol. 21 008, pp. 68-72.

Suzuki, A., "Lithography Advances on Multiple Fronts", EEdesign, EE Times, Jan. 5, 2004.

Switkes, M. et al., "Immersion Lithography at 157 nm", J. Vac. Sci. Technol. B., vol. 19, No. 6, Nov./Dec. 2001, pp. 2353-2356.

Switkes, M. et al., "Immersion Lithography at 157 nm", MIT Lincoln Lab, Orlando Jan. 2001, Dec. 17, 2001.

Switkes, M. et al., "Immersion Lithography: Optics for the 50 nm Node", 157 Anvers-1, Sep. 4, 2002.

European Office Action dated May 31, 2012 in corresponding European Patent Application No. 06 255 940.6.

* cited by examiner

SYSTEM AND METHOD TO INCREASE SURFACE TENSION AND CONTACT ANGLE IN IMMERSION LITHOGRAPHY

The present application is a continuation of U.S. patent application Ser. No. 11/288,133 filed on Nov. 29, 2005, now U.S. Pat. No. 7,773,195 now allowed, from which benefit is claimed under 35 U.S.C. §120. The entire contents of that application is herein fully incorporated by reference.

BACKGROUND

1. Field

The present invention relates to a lithographic apparatus and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask, a reticle, an array of individually controllable elements, etc. can be used to generate a circuit pattern to be formed on an individual layer of the IC. This pattern can be transferred onto a target portion (e.g., comprising part of, one, or several dies) on a substrate (e.g., a silicon wafer or a flat panel display substrate). Transfer of the pattern is typically via imaging onto a layer of radiation-sensitive material (resist) provided on the substrate.

In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g., water, so as to fill a space between the final element of the projection system and the substrate. The point of this is to enable imaging of smaller features since the exposure radiation will have a shorter wavelength in the liquid. The effect of the liquid can also be regarded as allowing the numerical aperture (NA) of the system to be higher than 1 and also increasing the depth of focus. Other immersion liquids have been proposed, including water with solid particles (e.g., quartz) suspended therein.

However, submersing the substrate or substrate and substrate table in a bath of liquid means that there is a large body of liquid that must be accelerated during a scanning exposure. This requires additional or more powerful motors and turbulence in the liquid can lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system).

A gap between the liquid supply system and the substrate allows these elements to move with respect to each other. Because of this gap, there is a need to have high surface tension between the immersion liquid and at least a "showerhead" portion of the liquid supply system to keep the immersion liquid from flowing through this gap. For example, a showerhead can be a portion of the liquid supply system that comprises inlet and outlet ports and/or channels. A problem that can arise in immersion lithography systems small contact angles between an immersion liquid and a surface of the substrate and the liquid supply system. This can be due to wetness effects of using certain materials for the liquid supply system and/or the immersion liquid. Small contact angles can lead to low surface tension between the immersion liquid and the showerhead. Thus, the immersion liquid may flow over the entire substrate surface or leak through the gap, which are both highly undesirable.

A still further problem is that certain immersion liquids cause corrosion of the liquid supply system when it is made from steel. Corrosion can contaminate the immersion liquid and cause defects on the substrate surface. One way to alleviate this problem is by changing of the immersion liquid. However, changing the immersion liquid can lead to other problems, such as wetness problems.

Therefore, what is needed is a system and method that allow for reduced wetness characteristics without causing contamination of the immersion liquids.

SUMMARY

One embodiment of the present invention provide a lithography system comprising an illumination system, a patterning device, a projection system, and a liquid supply system. The illumination system conditions a beam of radiation. The patterning device patterns the beam. The projection system projects the patterned beam onto a target portion of a substrate. The liquid, supply system at least partially fills a space between the projection system and the substrate with an immersion liquid having an index of refraction greater than that of water or 1.10.

In one example, at least a portion of a surface of the liquid supply system is coated with one of PTFE, TFE, a Teflon, and Teflon-like fluorinated hydrocarbon polymer.

In another example, at least a portion of a surface of the liquid supply system is made from one of PTFE, TFE, a Teflon, and Teflon-like fluorinated hydrocarbon polymer.

In a further example, the immersion liquid has an index of refraction greater than about 1.11, for example 1.65 for improved immersion lithography.

Another embodiment of the present invention provides a method. This method comprises projecting a patterned beam of radiation onto a target portion of a substrate using a projection system and at least partially filling a spaced between the projection system and the substrate with an immersion liquid having an, index of refraction greater than that of water or 1.10 from the liquid supply system. In one example, the immersion liquid is supplied using a liquid supply system, at least a portion of which is one of coated with or made from one of PTFE, TFE, TEFLON, and a Teflon-like fluorinated hydrocarbon polymer.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
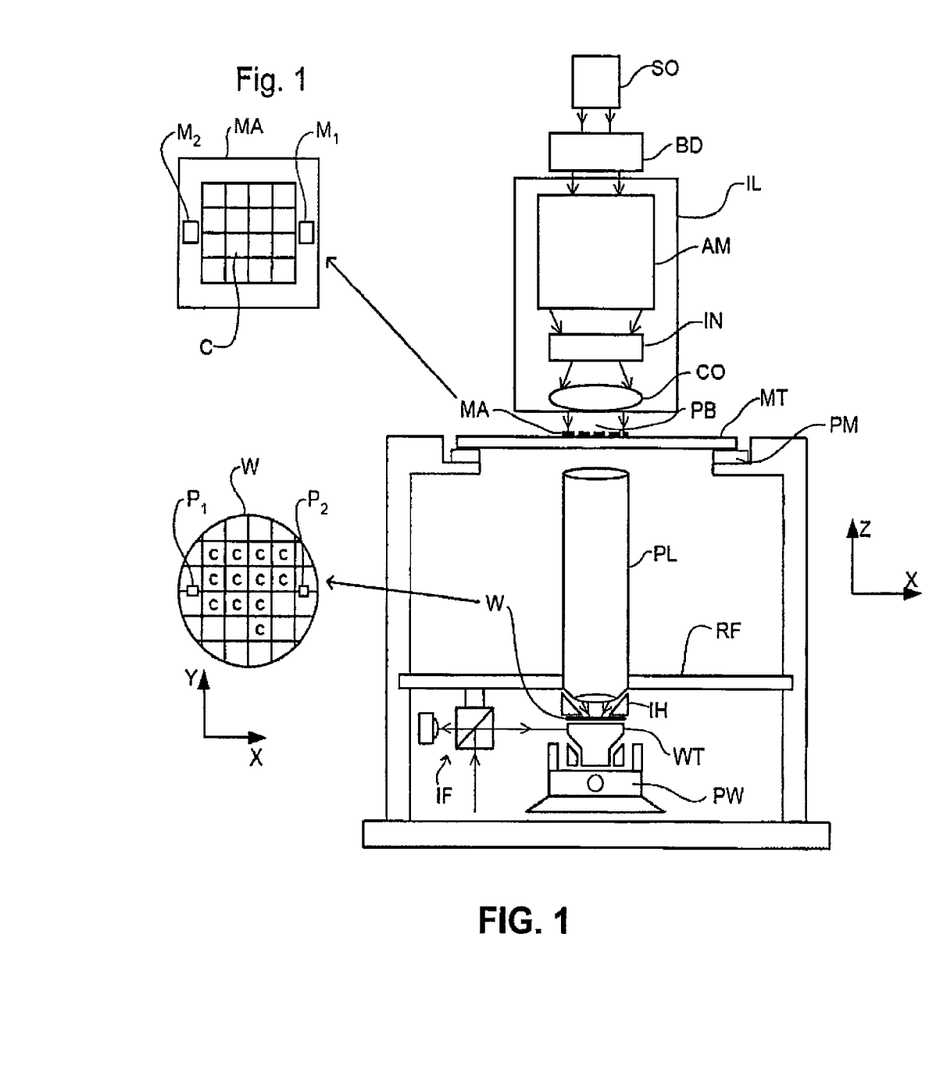
FIG. 1 depicts a lithographic apparatus according to an embodiment of the present invention

One or more embodiments of the present invention provide a system and method that allow organic fluids to be used in immersion lithographic systems. This is done by providing a showerhead portion of a liquid supply system that is partially coated or made from a TEFLON like material. The TEFLON like material reduces wetness effect, and thus increases containment, when using an organic immersion fluid in a space between the last optic and the substrate FIG. 1 schematically depicts a lithographic apparatus according to one embodiment of the invention. The apparatus comprises an illumination system, a support structure, a substrate table, and a projection system. The illumination system (illuminator) IL conditions a radiation beam PB (e.g., UV radiation or DUV radiation). The support structure (e.g., a mask table) MT supports a patterning device (e.g., a mask) MA and is connected to a first positioner PM configured to accurately position the patterning device in accordance with certain parameters. The substrate table (e.g., a wafer table) WT holds a substrate (e.g., a resist-coated wafer or a flat panel substrate) W and connected to a second positioner PW configured to accurately position the substrate in accordance with certain parameters. The projection system (e.g., a refractive projection lens system) PL projects a pattern imparted to the radiation beam PB by patterning device MA onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure can be a frame or a table, for example, which can be fixed or movable as required. The support structure can ensure that the patterning device is at a desired position, for example with respect to the projection system. Any use of the terms "reticle" or "mask" herein can be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device can be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system".

As here depicted, the apparatus is of a transmissive type (e.g., employing a transmissive mask). Alternatively, the apparatus can be of a reflective type (e.g., employing a programmable mirror array of a type as referred to above, or employing a reflective mask).

The lithographic apparatus can be of a type having two (dual stage) or more substrate tables (and/or two or more support structures). In such "multiple stage" machines the additional tables or support structure can be used in parallel, or preparatory steps can be carried out on one or more tables or support structures while one or more other tables or support structure are being used for exposure.

Referring to FIG. 1, the illuminator IL receives a radiation beam from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam, to have a desired uniformity and intensity distribution in its cross-section.

The radiation beam PB is incident on the patterning device MA, which is held on the support structure (e.g., mask table) MT, and is patterned by the patterning device. Having traversed the patterning device MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g., an interferometric device, linear encoder or capacitive sensor), the substrate table WT can be moved accurately, e.g., so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g., after mechanical retrieval from a mask library, or during a scan. In general, movement of the support structure MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW.

In the case of a stepper (as opposed to a scanner) the support structure MT can be connected to a short-stroke actuator only, or can be fixed. Patterning device MA and substrate W can be aligned using patterning device alignment marks M1, M2 and substrate alignment marks P1, P2.

Although the substrate alignment marks as illustrated occupy dedicated target portions, they can be located in spaces between target portions (these are known as scribe-lane alignment marks). Similarly, in situations in which more than one die is provided on the patterning device MA, the patterning device alignment marks can be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT can be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use can also be employed.

Figure 2:
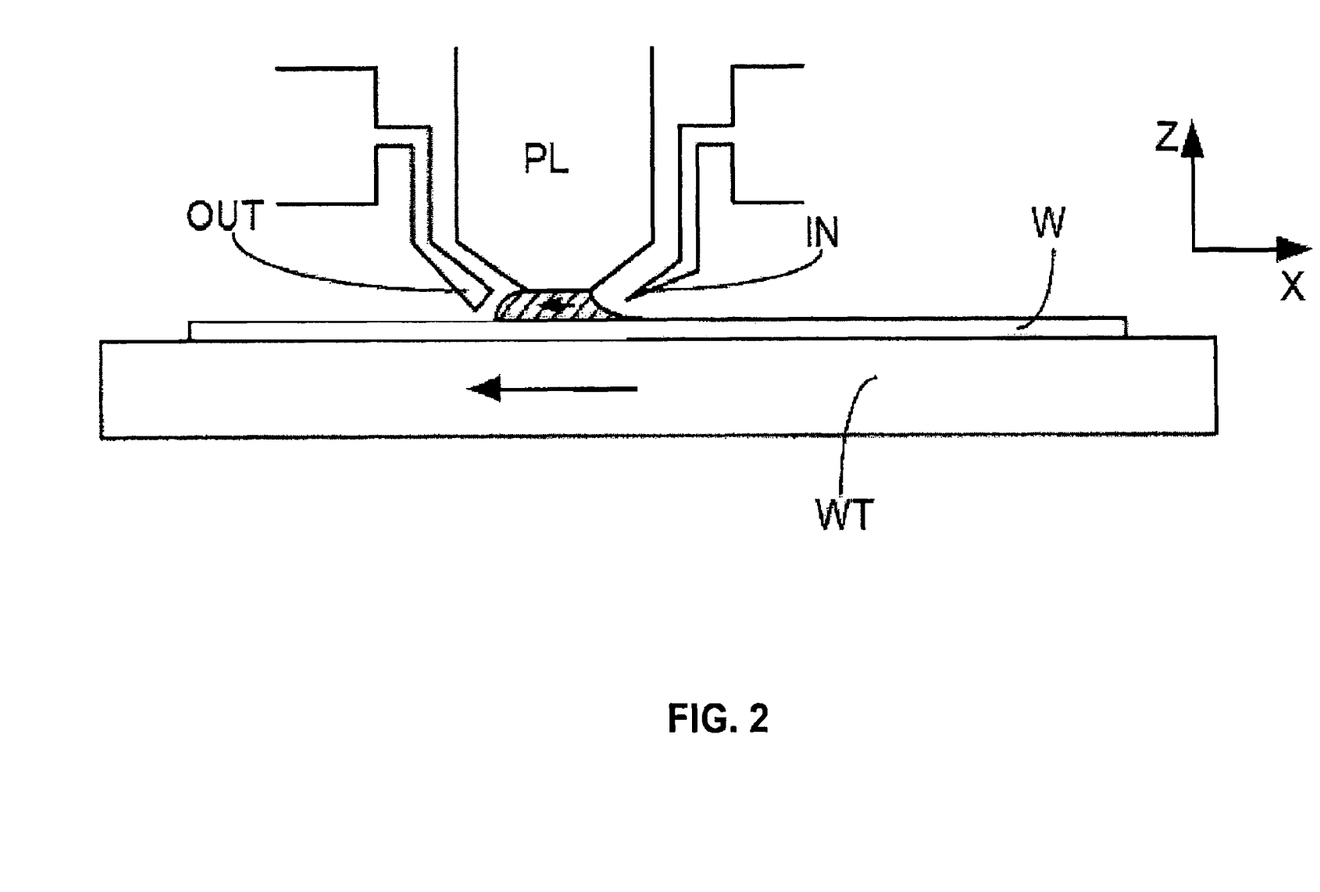
FIGS. 2 and 3 depict a liquid supply system for use in a lithographic projection apparatus.
Figure 3:
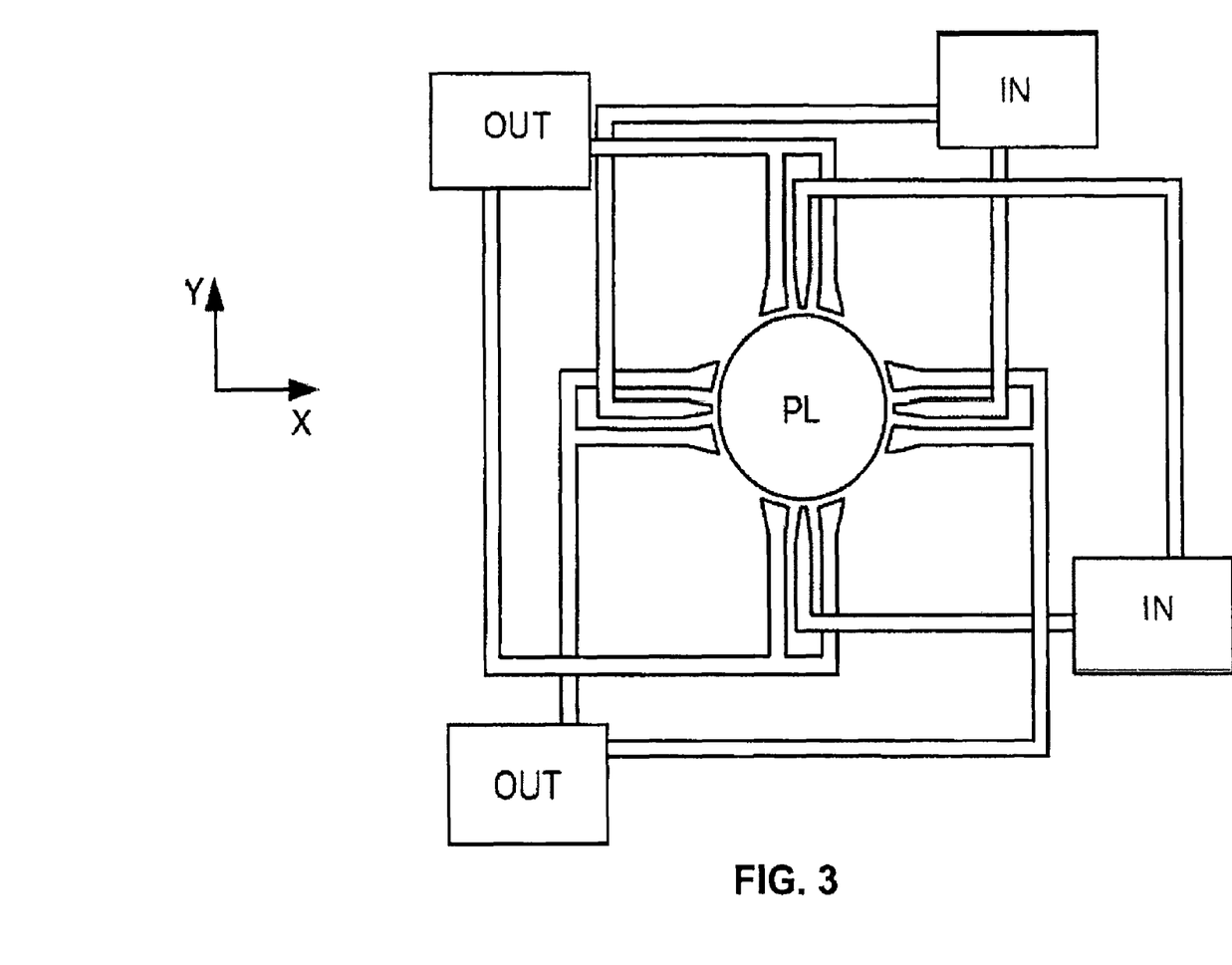

FIGS. 2 and 3 depict a liquid supply system for use in a lithographic projection apparatus. As illustrated in FIGS. 2 and 3, liquid, shown as a darkened area under projection system PL, is supplied by at least one inlet IN onto the substrate W along the direction of movement (shown as an arrow) of the substrate W relative to a final element of projection system PL. The liquid is removed by at least one outlet OUT after having passed under the projection system PL. That is, as the substrate W is scanned beneath the element in a −X direction, liquid is supplied at the +X side (in this perspective the right side) of the element and taken up at the −X side (in this perspective the left side) of the element.

FIG. 2 shows the arrangement schematically in which liquid is supplied via inlet IN and is taken up on the other side of the element by outlet OUT, which can be connected to a low pressure source. Although in the illustration of FIG. 2 the liquid is supplied along the direction of movement (noted by the arrow) of the substrate W relative to the final element of projection system PL, though this does not need to be the case.

Various orientations and numbers of in- and out-lets positioned around the final element are possible. For example, the arrangement shown in FIG. 3. In this example, four sets of an inlet with an outlet on either side are provided in a regular pattern around the final element of projection system PL.

Figure 4:
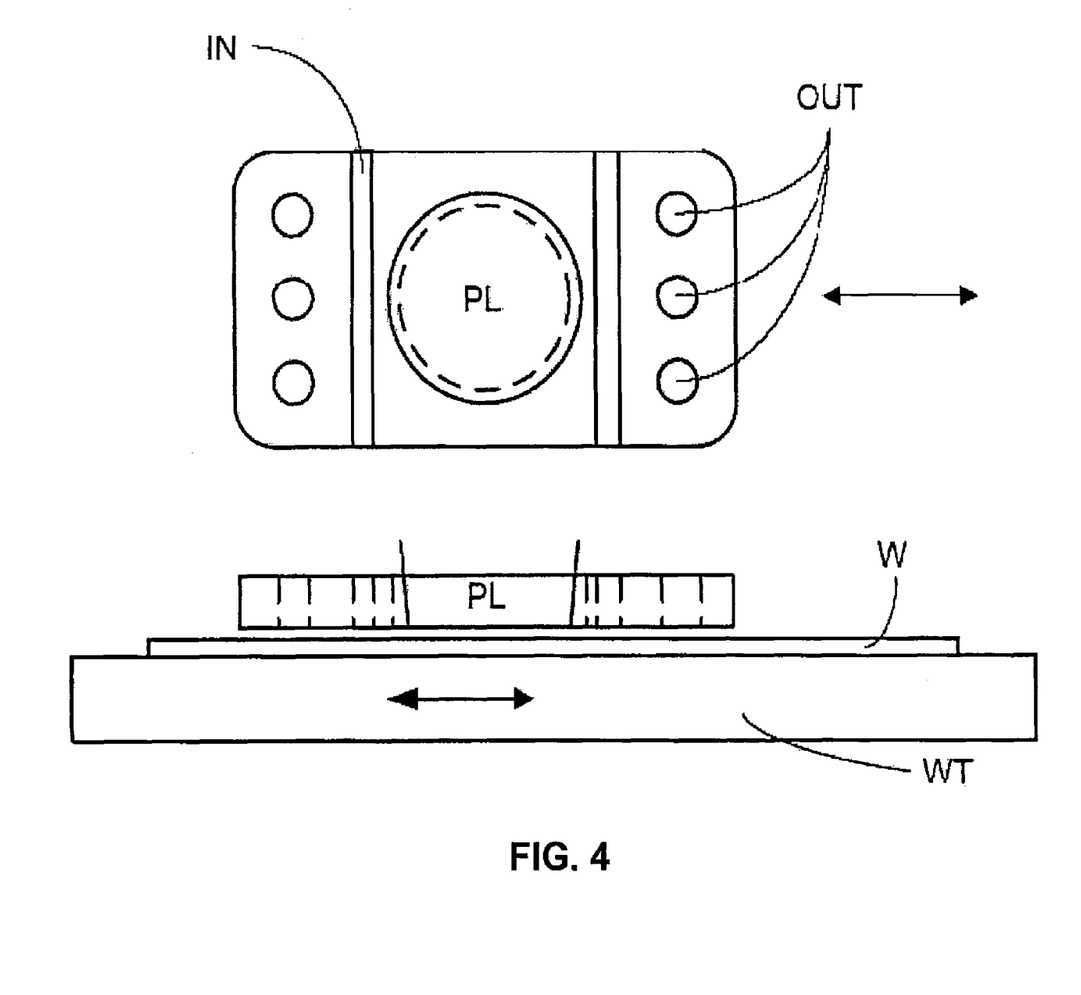
FIG. 4 depicts another liquid supply system for use in a lithographic projection apparatus.

FIG. 4 depicts another liquid supply system for use in a lithographic projection apparatus. In this example, a localized liquid supply system is shown. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its center, and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
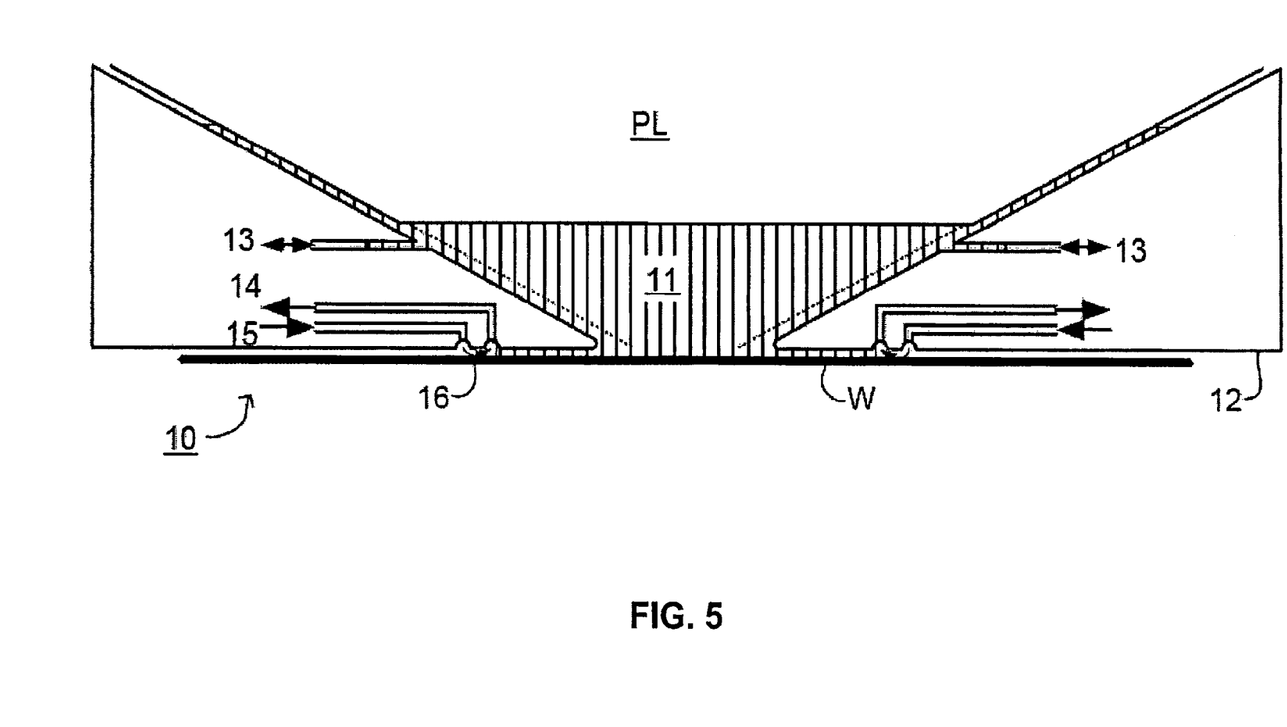
FIG. 5 depicts another liquid supply system for use in a lithographic projection apparatus.

FIG. 5 depicts another liquid supply system for use in a lithographic projection apparatus. In this example, a lithography device with a localized liquid supply system solution is to provide the liquid supply system with a liquid confinement structure 12 that extends along at least a part of a boundary of the space between the final element of the projection system PL and the substrate table WT. The liquid confinement structure 12 is substantially stationary relative to the projection system PL in the XY plane, though there can be some relative movement in the Z direction (in the direction of the optical axis). In an embodiment, a seal 16 is formed between the liquid confinement structure 12 and the surface of the substrate W.

In one example, reservoir 10 forms a contactless seal to the substrate W around the image field of the projection system PL so that liquid 11 is confined to fill a space between the substrate W surface and the final element of the projection system PL. The reservoir 10 is formed by a liquid confinement structure 12 positioned below and surrounding the final element of the projection system PL. Liquid 11 is brought into the space below the projection system PL and within the liquid confinement structure 12. The liquid confinement structure 12 extends a little above the final element of the projection system PL and the liquid level rises above the final element so that a buffer of liquid 11 is provided. The liquid confinement structure 12 has an inner periphery that at the upper end. In one example, the upper end closely conforms to the shape of the projection system PL or the final element thereof and can be, e.g., round. At the bottom, the inner periphery closely conforms to the shape of the image field, e.g., rectangular, though this need not be the case.

In one example, the liquid 11 is confined in the reservoir 10 by a gas seal 16 between the bottom of the liquid confinement structure 12 and the surface of the substrate W. The gas seal 16 is formed by gas. In various examples, the gas can be air, synthetic air, $N_2$ or another inert gas, which is provided under pressure via inlet 15 to the gap between liquid confinement structure 12 and substrate W and extracted via outlet 14. The overpressure on the gas inlet 15, vacuum level on the outlet 14, and geometry of the gap are arranged so that there is a high-velocity gas flow inwards that confines the liquid. Such a system is disclosed in U.S. Pat. No. 6,952,253 that issued Oct. 4, 2005, which is hereby incorporated by reference in its entirety.

In European Patent Application No. 03257072.3, which is incorporated by reference herein in its entirety, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Figure 6:
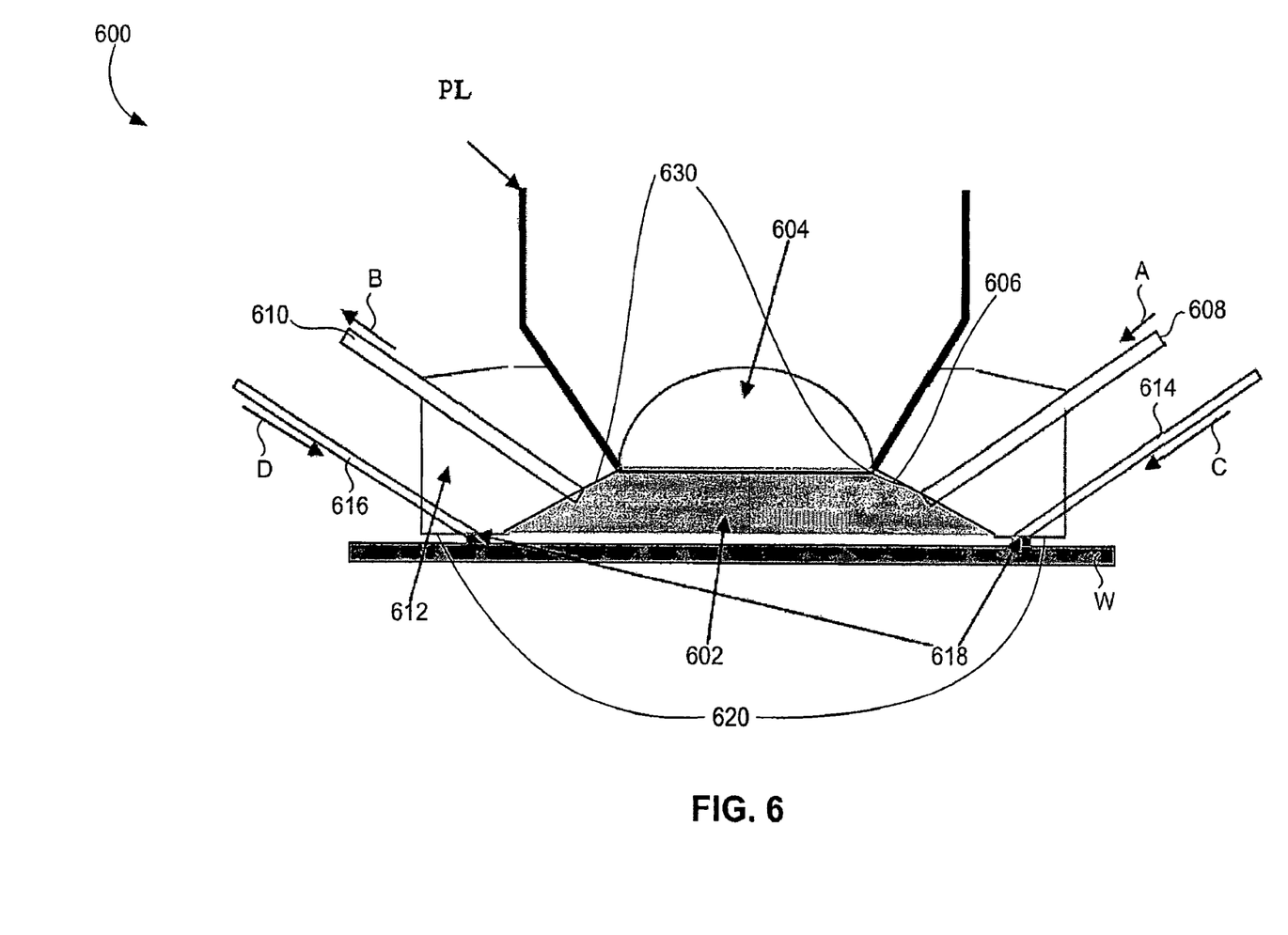
FIG. 6 shows a portion of a liquid supply system for use in a lithographic apparatus, according to one embodiment of the present invention.

FIG. 6 shows a portion 600 of a liquid supply system for use in a lithographic apparatus, according to one embodiment of the present invention. Portion 600 applies an immersion fluid 602 between a last optic 604 of a projection system PL and a substrate W. Immersion fluid 602 at least partially fills a space 606 between last optic 604 and substrate W. Immersion fluid 602 flows from a source (not shown) in the direction of arrow A through inlet 608 into space 606 and flows in the direction of arrow B through outlet 610 into a receptacle (not shown), for example similarly to as described above. Inlet and outlet 608 and 610, respectively, are located within a showerhead portion 612 of portion 600.

It is too be appreciated that projection system PL and immersion fluid 602 are moving with respect to substrate W, for example between about 200 mm and 400 mm per second, or more desirable around 300 mm a second. Thus, it is highly desirable to contain immersion fluid 602 during this movement. In one example, immersion fluid 602 is contained through surface tension with respect to a surface 630 of the liquid supply system.

In one example, a gas (e.g., nitrogen) also flows into space 606 in the direction of arrow C through inlet 614 and in the direction of arrow D through inlet 616. For example, the gas can form knife edges 618 in a gap 620 between showerhead 612 and substrate W. These knife edges 618 can act as a barrier or curtain to also assist in containing immersion fluid 602 and/or to prevent against oxygen entering immersion fluid 602. This can cause contamination and/or increased absorption to shorter wavelengths of light, e.g., in about the 1-300 nanometer range.

In one example, showerhead 612 can be made from a steel material, or the like. Using steel was satisfactory when water was used as immersion fluid 602. However, in order to increase numerical aperture of the last optic 604, different materials can be used for immersion fluid 602 that have higher indexes of refraction than water, for example organic fluids having index of refractions of about up to about 1.65, or above. This allows last optic 604 of projection system PL to exhibit higher NA characteristics, which increases resolution of a patterned beam to form smaller and more accurate features on substrate W. In one example, materials such as Decahydronaphthalene (Decalin) can be used, which has an index of refraction of 1.65. However, when steel is used for the showerhead 612, undesirable wetting effects have resulted. Small contact angles form between the organic immersion fluids and the showerhead 612 and the substrate W, which can overshadow the benefits of using the organic immersion fluid.

Figure 7:
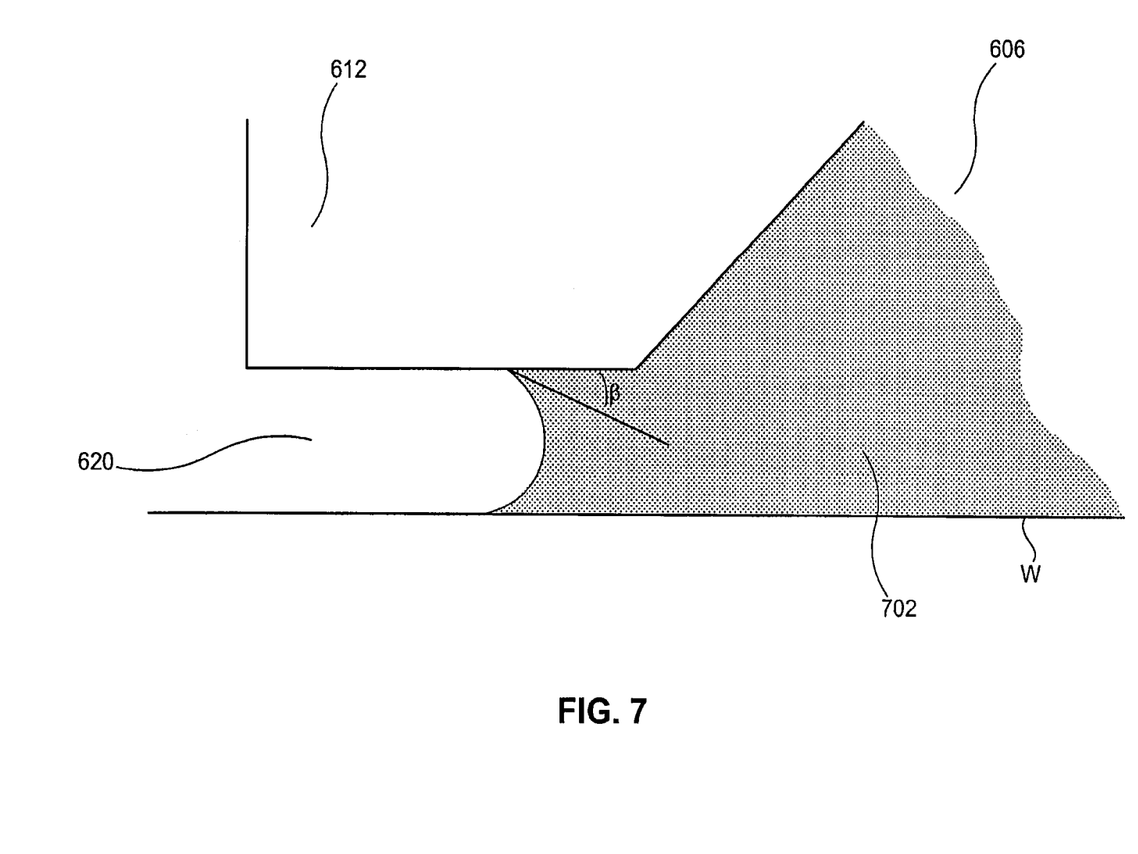
FIGS. 7 and 8 show contact angles of a fluid with respect to the portion of the liquid supply system shown in FIG. 6, according to embodiments of the present invention.

FIG. 7 shows a contact angle between an organic immersion fluid 702, having a higher index of refraction than water, and steel showerhead 612, according to one embodiment of the present invention. For example, contact angle β can be about 5° to about 7°, which is unacceptable. This is unacceptable because it results in an undesirable wetting effect across substrate W and showerhead 612, based on a low surface tension between these elements and immersion fluid 702. Wetting allows immersion fluid 702 to flow through gap 620, which is undesirable because the immersion fluid is no longer contained.

Figure 8:
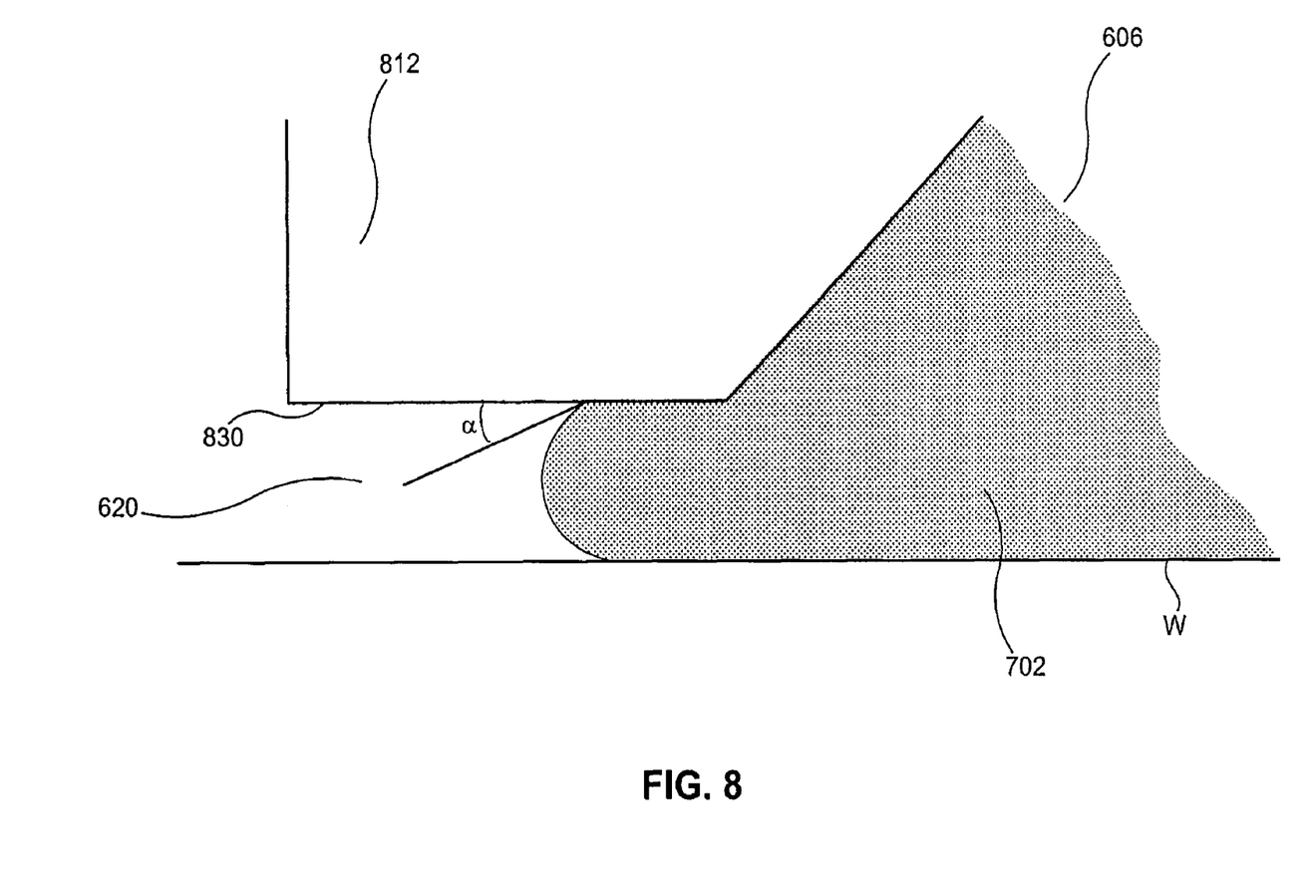

FIG. 8 shows a contact angle α between an organic immersion fluid 702, having a higher index of refraction than water, with respect to a showerhead 812, according to one embodiment of the present invention. In one example, showerhead 812 is coated along a surface 830 in contact with organic immersion fluid 702. In various example, the coating comprises a TEFLON like material, such as PTFE Poly-TetraFluorEthylene, TFE (TetraFluorEthylene), Teflon, CalF, or other a Teflon-like fluorinated hydrocarbon polymers. In another example, showerhead 812 can be made from a TEFLON like material, rather than just coating surface 830. It is to be appreciated that other materials that exhibit TEFLON like characteristics could also be used.

Using a TEFLON coating on showerhead 812 or making showerhead 812 from a TEFLON material can increase contact angle α to be about 40° to about 90°, which are highly desirable contact angles. Thus, in terms of contact angle β in FIG. 7 (which is the conventional contact angle between a liquid and a surface), the contact angle would be increased to be about 90° to about 140°. With this increase in contact angle, a high surface tension is exerted on immersion fluid 702 from showerhead 812, which substantially eliminates any flow of immersion fluid 702 through gap 620, e.g., allows for fluid containment. Thus, in a system using showerhead 812, last optic 604 can have a high numerical aperture, e.g., about 1.11 to about 1.65 or above, and organic immersion fluid can have a high index of refraction, e.g., 1.11-1.65 or above, without wetting. This can result in a better resolution of a patterned beam being projected by projection system PL onto substrate W, yielding smaller and more accurate features formed on substrate W.

As discussed above, another problem can be corrosion of a showerhead 612 when water is used as an immersion fluid 602. This corrosion can lead to contamination of immersion fluid 602, which can reduce transmission characteristics of immersion fluids. When short wavelengths of light are used, e.g., in a range of about 1 to 300 nm, this reduced transmission can result in undesirable patterns being formed on substrate W.

In one example, corrosion can be substantially reduced or eliminated by using a glass-ceramic composite material, such as a Zerodur material, or the like, for showerhead 612. This material is not as susceptible to corrosion from water as steel. Thus, using Zerodur, or the like, for showerhead 612 can substantially reduce or eliminate any contamination of immersion fluid 602 caused by erosion of showerhead 612.

Figure 9:
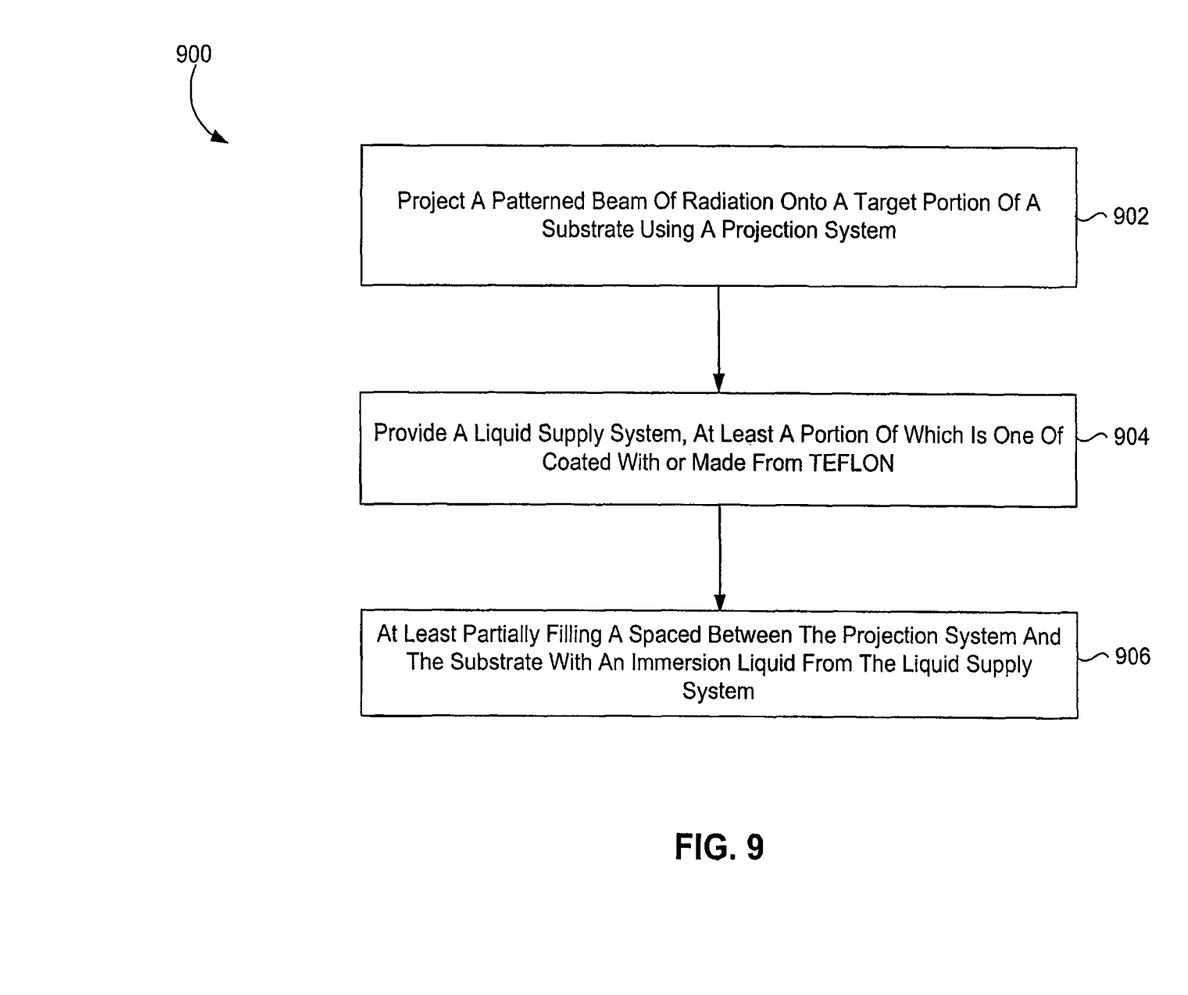
FIG. 9 shows a flowchart depicting a method, according to one embodiment of the present invention.

FIG. 9 shows a flowchart depicting a method 900, according to one embodiment of the present invention. In step 902, a patterned beam of radiation is projected onto a target portion of a substrate using a projection system. In step 904, a liquid supply system is provided. At least a portion of the liquid supply system is one of coated with or made from one of PTFE, TFE, Teflon, and a Teflon-like fluorinated hydrocarbon polymer. In step 906, a space between the projection system and the substrate is at least partially filled with an immersion liquid from the liquid supply system. Thus, wetness is reduced and containment of the organic immersion liquid is maintained.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm).

The term "lens", where the context allows, can refer to any one or combination of various types of optical components, including refractive and reflective optical components.

While specific embodiments of the invention have been described above, it will be appreciated that the invention can be practiced otherwise than as described. For example, where applicable, the invention can take the form of a computer program containing one or more sequences of machine-readable instructions describing a method as disclosed above, or a data storage medium (e.g., semiconductor memory, magnetic or optical disk) having such a computer program stored therein.

One or more embodiments of the invention can be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it can be a mechanism or combination of structures that provides a liquid to a space between the projection system and the substrate and/or substrate table. It can comprise a combination of one or more structures, one or more liquid inlets, one or more gas inlets, one or more gas outlets, and/or one or more liquid outlets that provide liquid to the space. In an embodiment, a surface of the space can be a portion of the substrate and/or substrate table, or a surface of the space can completely cover a surface of the substrate and/or substrate table, or the space can envelop the substrate and/or substrate table. The liquid supply system can optionally further include one or more elements to control the position, quantity, quality, shape, flow rate or any other features of the liquid.

The immersion liquid used in the apparatus can have different compositions, according to the desired properties and the wavelength of exposure radiation used. For an exposure wavelength of 193 nm, ultra pure water or water-based compositions can be used and for this reason the immersion liquid is sometimes referred to as water and water-related terms such as hydrophilic, hydrophobic, humidity, etc. can be used.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography system, comprising:
 a substrate table configured to support a substrate;
 a projection system to project a patterned beam of radiation onto a target portion of the substrate; and
 a liquid supply system to at least partially fill a space between the projection system and the substrate and/or the substrate table with an immersion liquid, the liquid supply system comprising a liquid confinement structure that extends along at least a part of a boundary of the space between the projection system and the substrate table and/or substrate, wherein the liquid confinement structure comprises a glass-ceramic and comprises a material to provide a contact angle of between about 90 degrees and 140 degrees with the liquid, wherein the material to provide the contact angle of between about 90 degrees and 140 degrees with the liquid is adjacent or located away from an inlet or outlet of the liquid supply system and is, in use, in contact with liquid supplied to the space from the inlet before removal by the outlet.

2. The lithography system of claim 1, wherein the immersion liquid is an organic immersion liquid.

3. The lithography system of claim 1, wherein a surface comprising the glass-ceramic, in use, opposes the substrate and/or the substrate table.

4. The lithography system of claim 1, wherein a surface comprising the glass-ceramic is located in a gap between the liquid supply system and the substrate and/or substrate table.

5. The lithography system of claim 1, wherein the immersion liquid has an index of refraction of about 1.65 or greater.

6. The lithography system of claim 1, wherein the material comprises PTFE, TFE, TEFLON, or a Teflon-like fluorinated hydrocarbon polymer.

7. The lithography system of claim 1, further comprising a gas supply system configured to supply gas that forms a gas curtain around the immersion liquid at the surface of the substrate.

8. The lithography system of claim 7, wherein the gas curtain protects the immersion liquid from oxygen.

9. A method, comprising:
 projecting a patterned beam of radiation, using a projection system, onto a target portion of a substrate held by a substrate table;
 at least partially filling a space between the projection system and the substrate and/or substrate table with an immersion liquid; and
 at least partly confining the liquid in the space using a liquid confinement structure that extends along at least a part of a boundary of the space, the liquid confinement structure comprising a glass-ceramic and comprising a material to provide a contact angle of between about 90 degrees, and 140 degrees with the liquid, wherein the material to provide the contact angle of between about 90 degrees and 140 degrees is adjacent or located away from an inlet or outlet of the liquid and is in contact with liquid supplied to the space from the inlet before removal by the outlet.

10. The method of claim 9, wherein the immersion liquid is an organic immersion liquid.

11. The method of claim 9, wherein a surface comprising the glass-ceramic opposes the substrate and/or the substrate table.

12. The method of claim 9, wherein a surface comprising the glass-ceramic is located in a gap between the liquid confinement structure and the substrate and/or substrate table.

13. The method of claim 9, wherein the immersion liquid has an index of refraction of about 1.65 or greater.

14. The method of claim 9, wherein the material comprises PTFE, TFE, TEFLON, or a Teflon-like fluorinated hydrocarbon polymer.

15. The method of claim 9, further comprising supplying gas that forms a gas curtain around the immersion liquid at the surface of the substrate.

16. The method of claim 15, wherein the gas curtain protects the immersion liquid from oxygen.

17. A lithography system, comprising:
 a substrate table configured to support a substrate;
 a projection system to project a patterned beam of radiation onto a target portion of the substrate; and
 a liquid supply system to at least partially fill a space between the projection system and the substrate and/or the substrate table with an immersion liquid, the liquid supply system comprising a liquid confinement structure that extends along at least a part of a boundary of the space between the projection system and the substrate table and/or substrate, wherein the liquid confinement structure comprises a glass-ceramic and the liquid supply system has a surface, adjacent or located away from an inlet or outlet of the liquid supply system to the space, to make a contact angle of between about 90° and about 140° with the immersion liquid, the surface of the liquid supply system, in use, in contact with liquid supplied to the space from the inlet before removal by the outlet and having a meniscus of liquid extending therefrom.

18. The lithography system of claim 17, wherein at least a portion of the surface is at least coated with PTFE, TFE, or a-fluorinated hydrocarbon polymer.

19. The lithography system of claim 17, wherein the immersion liquid is an organic immersion liquid.

20. The lithography system of claim 17, wherein a surface comprising the glass-ceramic, in use, opposes the substrate and/or the substrate table.

* * * * *

UNITED STATES PATENT AND TRADEMARK OFFICE
CERTIFICATE OF CORRECTION

PATENT NO. : 8,456,611 B2  
APPLICATION NO. : 12/834691  
DATED : June 4, 2013  
INVENTOR(S) : Harry Sewell Page 1 of 1

It is certified that error appears in the above-identified patent and that said Letters Patent is hereby corrected as shown below:

On title page, Item [56] References Cited - Other Publications
replace "Chinese Office Action for Chinese Application No. 200610160480.3 2009 dated Sep. 4, 2009."
with --Chinese Office Action for Chinese Application No. 200610160480.3 dated Sep. 4, 2009.--

Signed and Sealed this
Sixth Day of August, 2013

Teresa Stanek Rea
*Acting Director of the United States Patent and Trademark Office*